(12) United States Patent
Dhindsa et al.

(10) Patent No.: US 7,393,432 B2
(45) Date of Patent: Jul. 1, 2008

(54) RF GROUND SWITCH FOR PLASMA PROCESSING SYSTEM

(75) Inventors: Rajinder Dhindsa, San Jose, CA (US); Felix Kozakevich, Sunnyvale, CA (US); Eric Lenz, Pleasanton, CA (US); Russell Martin, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 10/953,229

(22) Filed: Sep. 29, 2004

(65) Prior Publication Data
US 2006/0065369 A1    Mar. 30, 2006

(51) Int. Cl.
C23F 1/00 (2006.01)
H01L 21/306 (2006.01)
C23C 16/00 (2006.01)

(52) U.S. Cl. ............................ 156/345.44; 118/723 E
(58) Field of Classification Search ............ 156/345.43, 156/345.44; 118/722, 723 R, 723 E
See application file for complete search history.

(56) References Cited

U.S. PATENT DOCUMENTS 5,877,471 A * 3/1999 Huhn et al. ............ 219/121.49
5,897,389 A * 4/1999 Dietz et al. .................. 439/188
6,202,589 B1 * 3/2001 Grahn et al. ............ 118/723 R
6,779,481 B2 * 8/2004 Kent et al. ............... 118/723 R

OTHER PUBLICATIONS

"International Search Report," mailed Dec. 6, 2007, for Application No. PCT/US05/34073; Filed on Sep. 23, 2005; Applicants Lam Research Corporation.
"Written Opinion," mailed Dec. 6, 2007, for Application No. PCT/US05/34073; Filed on Sep. 23, 2005; Applicants: Lam Research Corporation.
"International Preliminary Report," mailed Jan. 31, 2008, for Application No. PCT/US05/34073; Filed Sep. 23, 2005; Applicants: Lam Research Corporation.

* cited by examiner

*Primary Examiner*—Parviz Hassanzadeh
*Assistant Examiner*—Maureen G Arancibia
(74) *Attorney, Agent, or Firm*—IP Strategy Group, P.C.

(57) ABSTRACT

An arrangement in a plasma processing system for selectively providing an RF grounding path between an electrode and ground. The arrangement includes an RF conduction path structure and an annular structure. The annular structure and the RF conduction path structure having two relative positions relative to one another. A first relative position of the two relative positions is characterized by the annular structure electrically coupling with the RF conduction path structure to provide a ground to the RF conduction path structure. A second relative position of the two relative positions is characterized by the annular structure being electrically uncoupled from the RF conduction path.

17 Claims, 4 Drawing Sheets

RF GROUND SWITCH FOR PLASMA PROCESSING SYSTEM

BACKGROUND OF THE INVENTION

Plasma processing systems have long been employed to process substrates, such as silicon substrates or other substrates, to form semiconductor devices, nano-machines, etc. Plasma processing is particularly effective in etching applications, wherein a plasma formed from an etchant source gas mixture is employed to selectively etch a layer on the substrate. To etch a substrate in a plasma processing system, the substrate is disposed inside a plasma processing chamber, and an etchant source gas is flowed into the chamber. The etchant source gas is ignited to form a plasma, which then exposed etch areas of the target layer on the substrate, i.e., areas not protected by a mask. Plasma is ignited and sustained using RF energy, which is provided to one or more electrodes in the plasma processing chamber.

In a capacitively coupled plasma processing system, one or more electrodes may be provided in each processing chamber. RF energy having various frequencies may be provided to one or more of the electrodes of the capacitively coupled plasma processing system. For example, if there are provided an upper and a lower electrodes, 2 MHz, 27 MHz and 60 MHz RF signals may be provided to one or both of the electrodes.

Some etch applications may require that the upper electrode be grounded with respect to one or more of the RF frequencies. To clarify, the upper electrode in a plasma processing chamber represents the electrode that is opposite to the substrate and separate from the substrate by a plasma cloud during plasma processing. The lower electrode represents the electrode on which the substrate is disposed for processing. For example, certain etch applications require the upper electrode to be grounded with respect to the lower frequency RF signal (e.g., 2 MHz). Another etch application may require the upper electrode to be grounded with respect to the higher frequency RF signal (e.g., 27 MHz and/or 60 MHz). Still another etch application may require the upper electrode to be grounded with respect to all of the RF signal frequencies (e.g., 2 MHz, 27 MHz, and 60 MHz). Since a given chamber may be employed for different etch steps, each of which may have a different grounding requirement, the ability to selectively ground the upper electrode with respect to one or more or all of the RF frequencies is highly desirable.

In the prior art, a relay and an inductor combination may be employed to ground one or more of the RF frequencies. FIG. 1 shows such an example wherein relay R1 is employed to control the current flow through an inductor L1. When relay R1 is closed, current flows through L1. L1 functions as a filter that, depending on the value of L1, effectively filters out certain frequencies from the output OUT.

It has been found that the use of the relay/inductor is unsuitable for certain processing systems due to the space constraint imposed by the relay/inductor combination. Further, it has been found the relay/inductor arrangement for grounding RF signals tends to be more effective for RF signals at the lower frequency ranges and tends to be less effective for RF signals at the higher frequency ranges. This is because the high impedance presented by the inductor L1 renders the combination less effective for grounding high frequency RF signals (e.g., 60 MHz RF signal). Yet, in some etch applications, effective grounding of selected or all RF signals is a requirement for good process results (e.g., good plasma uniformity and good etch rate uniformity).

What is desired, therefore, is an arrangement for effectively grounding, in a selectable manner, all the RF signals that are supplied to one or more electrodes of the plasma processing chamber. More preferably, an arrangement is desired to effectively ground all RF signals supplied to the upper electrode in a plasma processing chamber.

SUMMARY OF INVENTION

The invention relates, in an embodiment, to an arrangement in a plasma processing system for selectively providing an RF grounding path between an electrode and ground. The arrangement includes an RF conduction path structure, the RF conduction path structure being configured to provide an RF conduction path between an RF power subsystem and the electrode. The arrangement further includes an annular structure formed of an electrically conductive material, the annular structure and the RF conduction path structure having two relative positions relative to one another. A first relative position of the two relative positions is characterized by the annular structure electrically coupling with the RF conduction path structure to provide a ground to the RF conduction path structure. A second relative position of the two relative positions is characterized by the annular structure being electrically uncoupled from the RF conduction path.

In another embodiment, the invention relates to a method for selectively providing an RF grounding path between an electrode and ground in a plasma processing system. The method includes providing an RF conduction path structure, the RF conduction path structure being configured to provide an RF conduction path between an RF power subsystem and the electrode. The method also includes providing an annular structure formed of an electrically conductive material. The method additionally includes positioning the RF conduction path structure and the annular structure in one of two relative positions relative to one another. A first relative position of the two relative positions is characterized by the annular structure electrically coupling with the RF conduction path structure to provide a ground to the RF conduction path structure. A second relative position of the two relative positions is characterized by the annular structure being electrically uncoupled from the RF conduction path.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
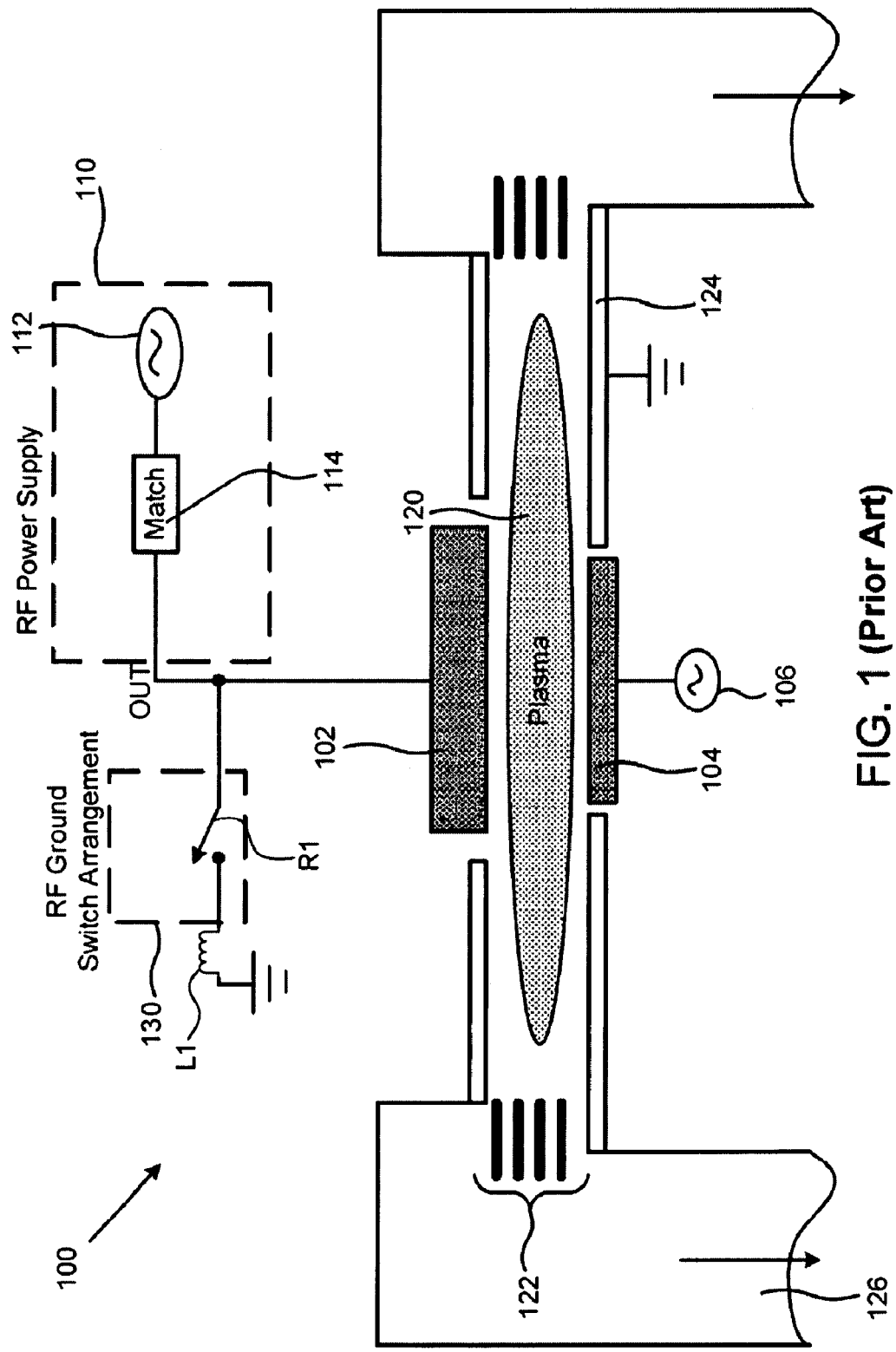
FIG. 1 shows such an example arrangement wherein a relay is employed to control the current flow through an inductor to filter out one or more frequencies.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In embodiments of the invention, there is provided an arrangement that acts as an RF switch between the RF conduction path structure, which is electrically coupled to the upper electrode, and ground to selectively couple the upper electrode to and selectively decouple the upper electrode from ground. The RF switch structure has an annular shape to maximize electrical contact with the RF conduction path structure associated with the upper electrode during grounding.

In an embodiment, the RF switch arrangement includes an annular conductive structure that is formed of an electrically conductive material, such as beryllium copper (BeCu). The annular conductive structure is grounded. In its default position, the annular conductive structure electrically contacts the RF conduction path structure to provide RF grounding to the upper electrode. An insulator structure is provided and is coupled to an actuator mechanism. The actuator mechanism, which may be pneumatic, hydraulic, or electrical, moves the insulator structure such that the insulator structure is disposed alternately in a first insulator position and a second insulator position. In the first insulator position, the insulator structure is interposed between the annular conductive structure and the RF conduction path structure to break the electrical contact therebetween. In the second insulator position, the insulator structure is removed from the region in between the annular conductive structure and the RF conduction path structure to allow the annular conductive structure to provide grounding to the RF conduction path structure (and by extension, to the upper electrode). The material selected for the annular conductive structure preferably has a high resistance to fatigue and is resilient in nature, thereby enabling the annular conductive structure to be repeatedly flexed to make and break electrical contact.

In other embodiments, there is no insulator structure and the annular conductive structure itself is moved into and out of contact with the RF conduction path to make and break RF grounding contact. For example, the RF conduction path structure may be sloped such that in one position, the annular conductive structure electrically contacts the RF conduction path structure, and in another position, the annular conductive structure is electrically decoupled from the RF conduction path. The movement could be a linear movement along the line that is perpendicular to the substrate during plasma processing or it may be a radial movement, causing the radius of the annular conductive structure to expand and contract to make and break contact. In other embodiments, the reverse is true in that the annular conductive structure is fixed and the RF conduction path structure that is coupled to the upper electrode is moved by the actuator to make and break electrical contact with the annular conductive structure.

In embodiments of the invention, the RF switch is integrated with a frequency-selective filter arrangement to offer a greater number of options with regard to RF grounding. The frequency selective filter arrangement is employed when selective grounding of certain RF signals having certain RF frequencies is desired. When it is desirable to provide a ground to the upper electrode to ground all RF signals irrespective of their frequencies, the annular RF switch is employed. In an embodiment, RF grounding via actuator activation is integrated into the software that controls plasma processing, thereby enabling automatic reconfiguration of the RF grounding of the upper electrode to suit the requirements of different etch applications.

The features and advantage of the present invention may be better understood with reference to the figures and discussions that follow. FIG. 1 shows, in accordance with an embodiment of the present invention, an electrical diagram of a capacitively coupled plasma processing chamber 100, including an upper electrode 102 and a lower electrode 104 upon which a substrate (not shown) is disposed during plasma processing. In the example of FIG. 1, the lower electrode is supplied by RF power supply 106 with three RF signals having RF frequencies of 2 MHz, 27 MHz, and 60 MHz. Upper electrode 102 is supplied a plurality of RF frequencies by an RF power supply 110. For clarity, RF power supply 110 is illustrated in greater detail to include an RF source 112 and a match network 114.

During plasma processing, an etchant source gas is introduced into the region between upper electrode 102 and lower electrode 104 and ignited to form a plasma cloud 120. The plasma cloud is confined by focus rings 122 and grounded chamber walls 124. Etch by-products are exhausted via exhaust path 126.

A RF ground switch arrangement 130 is provided to selectively couple upper electrode 102 with the RF ground. When RF ground switch arrangement 130 closes, a conductive path from upper electrode 102 and ground is created, thus providing the RF grounding to upper electrode 102. When RF ground switch arrangement 130 opens, no conductive path exists between upper electrode 102 and the RF ground.

Figure 2:
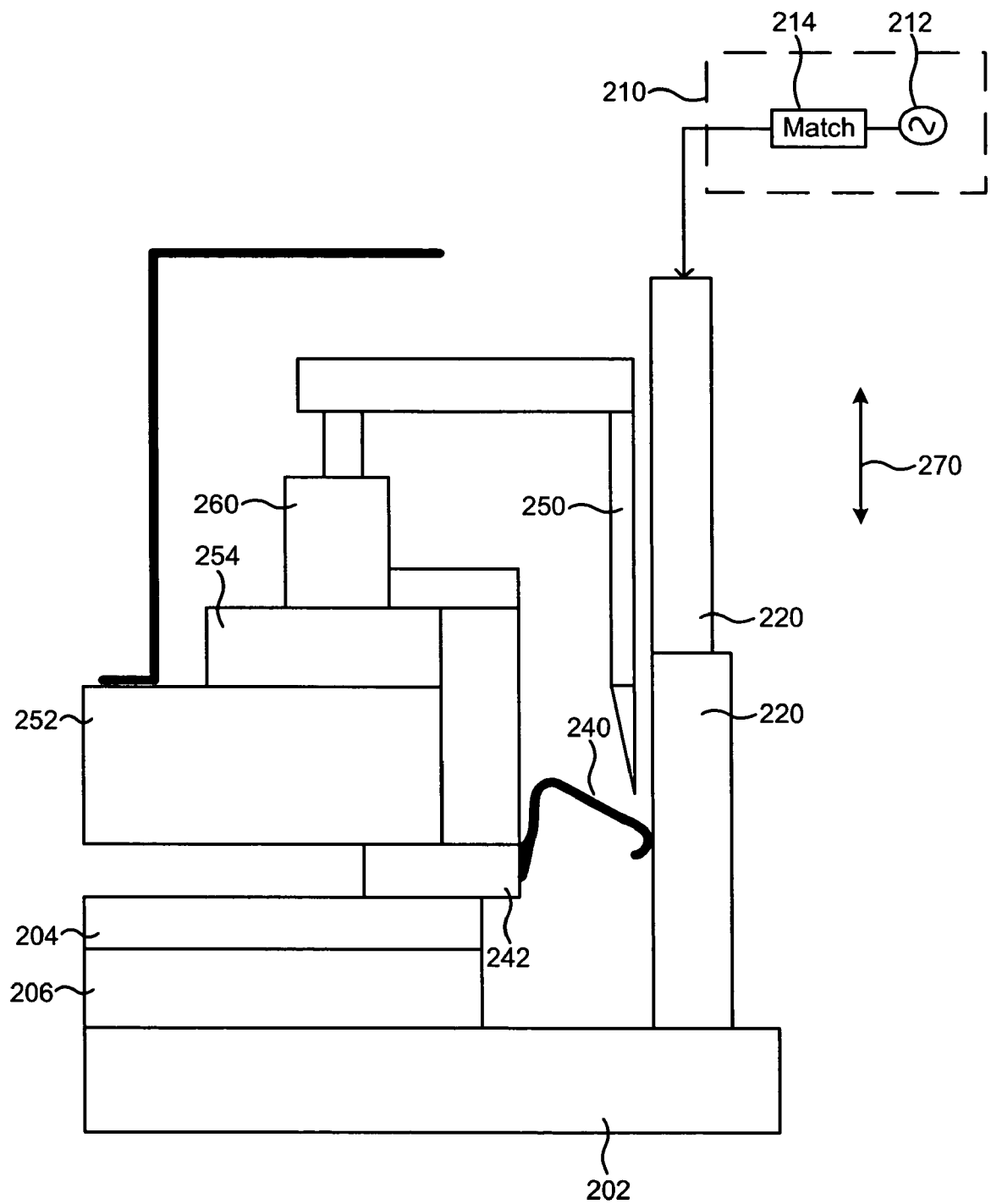
FIG. 2 shows, in accordance with an embodiment of the invention, an implementation of the RF ground switch arrangement.

To fully ground the upper electrode, which may be supplied with a plurality of high-powered RF signals having various low and high RF frequencies, a low impedance grounding path is desired. The challenge is to provide a RF ground switch arrangement that can reliably, over thousands or millions of cycles, provide a low-impedance RF grounding path when desired and can break the RF grounding path when such grounding is not desired. FIG. 2 shows, in accordance with an embodiment of the invention, an implementation of the RF ground switch arrangement 130. FIG. 2 shows an upper electrode 202, which may be formed of, for example, aluminum. Upper electrode 202 is insulated from ground structure 204 by an insulator 206, which may be formed of, for example, aluminum nitride (AlN). The insulation provided by insulator 206 allows upper electrode 202 to be powered by RF signals when such RF signals on upper electrode 202 is desired.

Upper electrode 202 is connected to an RF power supply 210 (which includes an RF source 212 and an RF match 214) by an RF conduction path structure 220. RF conduction path structure 220 may be formed of, for example, aluminum. An annular switch arrangement 240 is provided to provide selective grounding between ground 204 (through conductor 242) and upper electrode 202 (through the use of RF conduction path structure 220). In its default position, fingers of annular switch arrangement 240 is shaped such that the fingers naturally bias against RF conduction path structure 220 to provide electrical contact. As such, a grounding path exists between upper electrode 202 and ground 204 (via RF conduction path 220 and conductor 242). Since annular switch arrangement 240 is annular in shape, the individual fingers are disposed around the circumference of the annular switch arrangement, providing maximum electrical contact with RF conduction path structure 220 to provide a highly effective grounding path. The number of fingers may be variable and may vary from a few to a dozen to hundreds of fingers.

An insulator structure 250 is shown in FIG. 2. Insulator structure 250 is operatively coupled with an actuator arrangement that includes an actuator 260, which is mechanically supported by structures 252 and 254. In the example of FIG. 2, structure 252 also serves as a heat sink to help remove heat from the upper electrode assembly. Insulator 250 is annular in shape and is actuated by actuator 260 to move up and down in the direction of arrow 270, which is a perpendicular direction to the substrate when the substrate is disposed in the chamber for plasma processing.

In the position shown in FIG. 2, insulator 250 is positioned away from the region between annular switch arrangement 240 and RF conduction path structure 220. When actuator 260 moves insulator 250 downward along the direction of arrow 270 to interpose between annular switch arrangement 240 and RF conduction path structure 220, electrical contact between annular switch arrangement 240 and RF conduction path structure 220 is broken. To ensure complete electrical isolation, insulator 250 may be annular in shape in one embodiment. When this happens, upper electrode 202 is no longer grounded. In this manner, insulator 250 acting together with annular switch arrangement allows the grounding path between upper electrode 202 and ground 204 to be selectively made and broken.

In an embodiment, the annular switch arrangement is made of BeCu since BeCu is a material that has a highly conductive material that has a high tensile strength while being capable of being repeatedly bent and rebent to break and make electrical contact. However, any other material that has such characteristics may be employed. Note that the choice of materials for the annular switch arrangement is substantially broadened by the fact that the entire switch arrangement is disposed outside of the plasma processing environment, thereby substantially obviating contamination concerns and plasma-induced damage concerns.

In an embodiment, insulator 250 is made from a plastic material, such as ULTEM®, a polyimide thermoplastic material available from General Electric Company of Fairfield, Conn. However, any type of material that has a high dielectric strength so that it is capable of withstanding a high level of RF energy can be employed. Preferably, the insulator material of insulator 250 has a relatively low dielectric constant in order to minimize capacitance. For example, certain types of ceramics or other non-conductive materials may well be employed.

Figure 3:
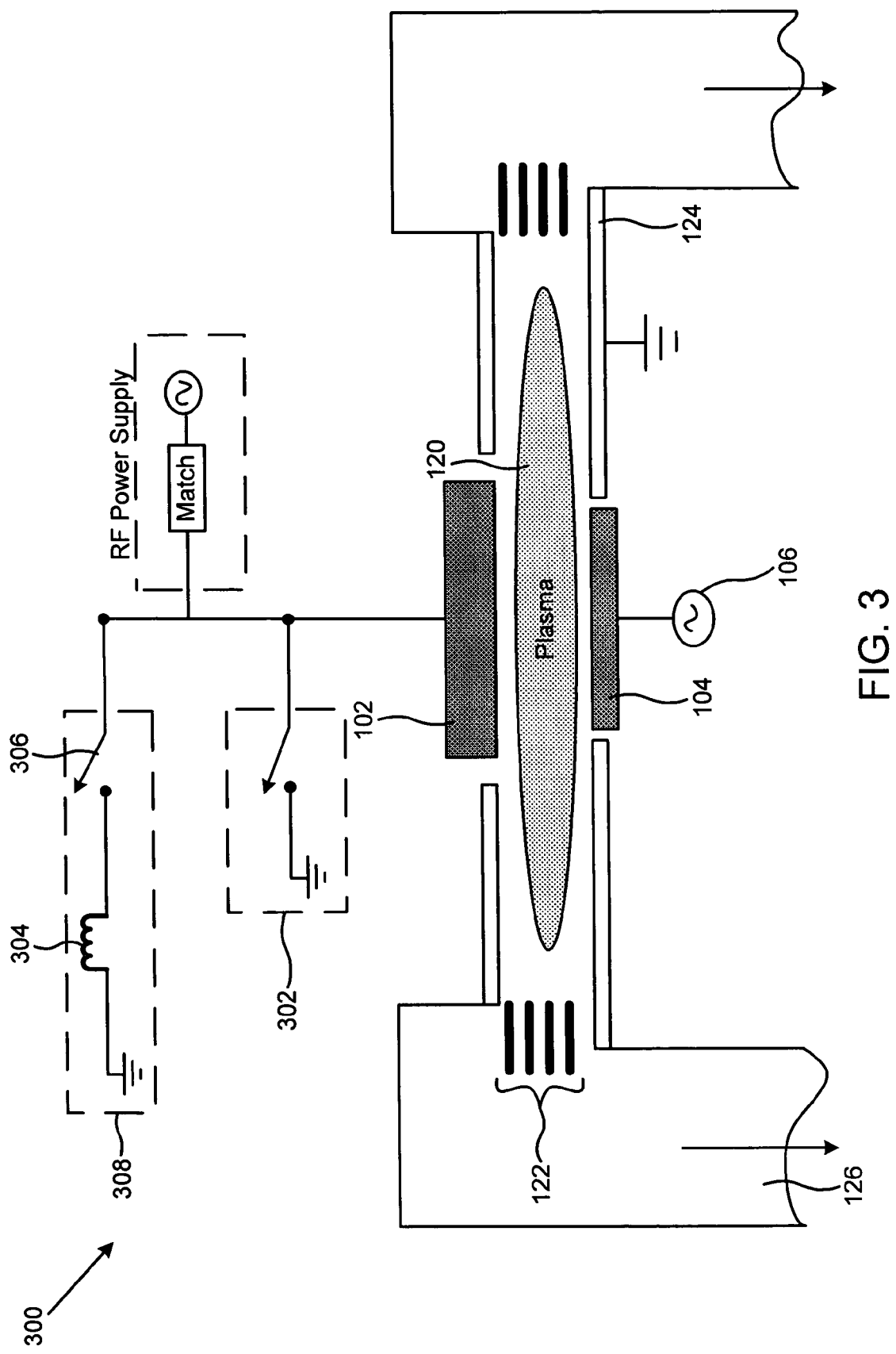
FIG. 3 is an electrical diagram illustrating, in accordance with an embodiment of the present invention, a combination of switches to allow the system operator to either ground all RF signals using an annular RF switch or to ground only selected RF frequencies.

The arrangement of FIG. 2 provides the process engineer with the ability to ground all RF signals that may be provided to the upper electrode. In some situations, it may be desirable to ground only selected RF signals having selected RF frequencies. In accordance with an embodiment of the present invention, the annular RF switch of the present invention is electrically connected in parallel with a RF switch that employs a relay/inductor combination. By keeping the annular RF switch closed (so that there is a conductive path between the upper electrode and ground) and choosing the appropriate value of the inductor and closing the relay, selected RF signals may be filtered (i.e., grounded). FIG. 3 is an electrical diagram illustrating, in accordance with an embodiment of the present invention, such a combination of switches to allow the system operator to either ground all RF signals using the annular RF switch 302 or ground only selected RF frequencies using an appropriate inductor 304 and a closed relay 306 in an RF switch 308.

Figure 4:
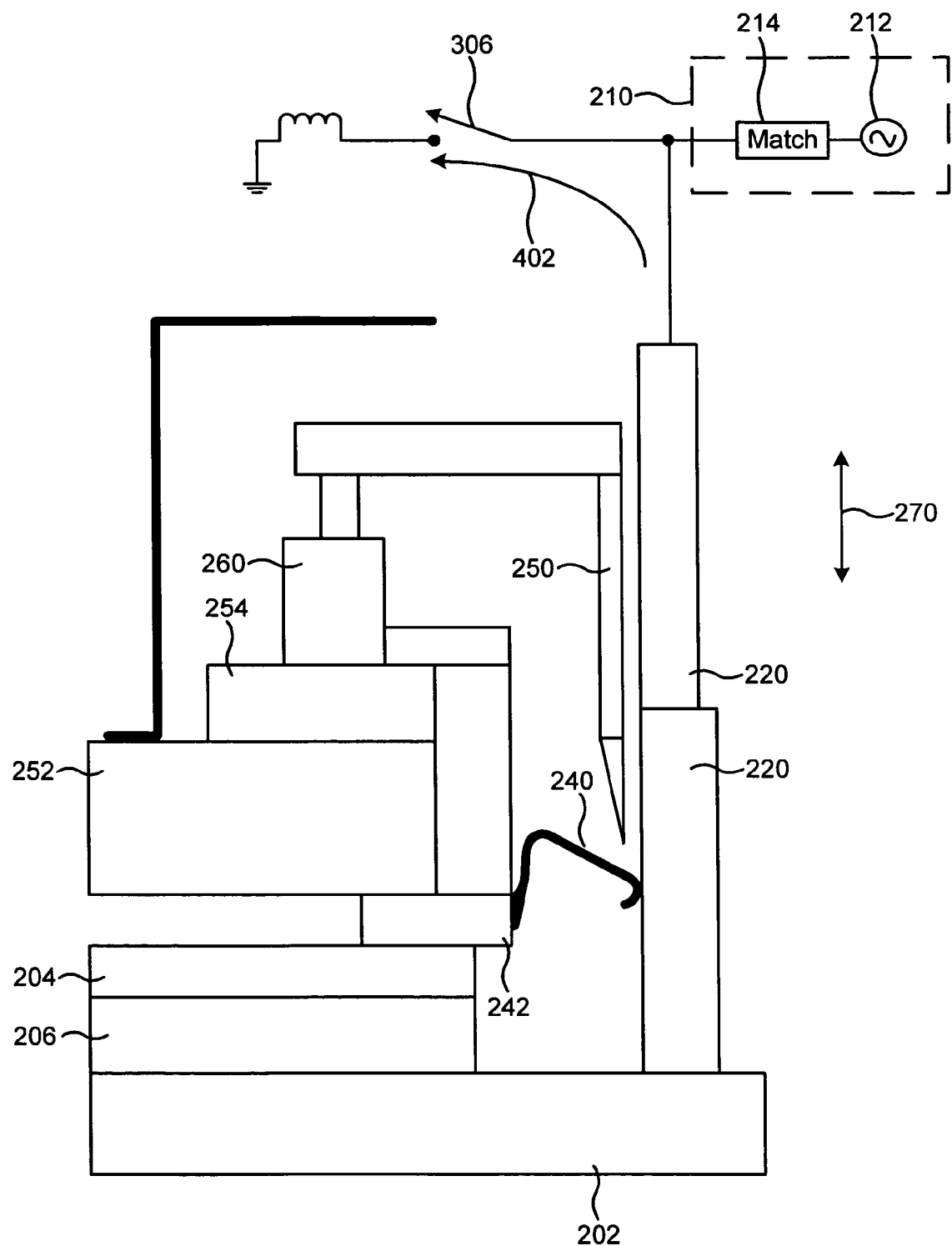
FIG. 4 illustrates, in accordance with an embodiment of the invention, a plasma processing arrangement that includes the RF ground switch arrangement.

FIG. 4 illustrates, in accordance with an embodiment of the invention, how the combination of FIG. 3 may be implemented on the example shown previously in FIG. 2. In FIG. 4, when inductor 250 is not breaking the conductive path between RF conduction path structure 220 and annular switch structure 240, relay 306 may be closed to allow current to flow to ground in the direction of arrow 402. By choosing an appropriate value for inductor 304, selected RF signals having selected RF frequencies may be shunted to ground.

As can be appreciated from the foregoing, the annular RF switch of the present invention is suitable for grounding all RF frequencies, even the higher RF frequencies (e.g., 60 MHz or higher) that has proven problematic for the prior art relay/inductor RF switch. The use of the annular ring having multiple contact fingers maximize electrical contact in order to assure a good conductive path to ground. In an embodiment, the use of BeCu for the annular switch arrangement assures a high switch cycle life and high conductivity to ground. Further, the use of a high dielectric strength insulator material to break the contact between ground and the RF hot part (such as RF conduction path structure 220) advantageously assures complete RF isolation from ground and a long cycle life. The actuator control can be integrated with the control software of the plasma processing chamber to provide completely automatic reconfiguration of the RF grounding of the upper electrode. In an embodiment, the use of a pneumatic (or hydraulic) actuator obviates concerns regarding electrical interference from the adjacent hot RF parts.

While this invention has been described in terms of several embodiments, there are alterations, permutations, and equivalents, which fall within the scope of this invention. For example, although the examples shown involves moving the insulator 220 in the direction of arrow 270, the insulator can be moved in other direction in an arrangement where such movement would cause the conductive path from the upper electrode to ground to be selectively completed and broken. As another example, the insulator may not be required and/or the annular switch structure or the RF conduction path structure may be moved by an actuator, either in the direction of arrow 270 or in another direction, to cause the conductive path from the upper electrode to ground to be selectively completed and broken. This can be accomplished by changing the dimension, shape, or location of the annular switch structure and/or the RF conduction path structure, for example. As an example, the fingers of the annular switch structure may be bent by an actuator or moved radially inward or outward to selectively make and break electrical contact.

As another example, although a capacitively coupled plasma processing chamber is employed for illustration, it is contemplated that the invention may also be practiced in a plasma processing chamber that employs another technology for plasma ignition and sustenance (e.g., in an inductively coupled plasma processing chamber, in a electron-cyclotron resonance plasma processing chamber, etc.). As a further example, although the RF ground switch arrangement of the examples herein is discussed in connection with the upper electrode, the RF ground switch arrangement may be employed to ground the upper electrode, the lower electrode, both electrodes, or any electrode combination in a plasma processing system. As a further example, the frequency range that may be grounded by the RF ground switch arrangement disclosed herein may range from the low kilohertz range to 300 Megahertz and higher.

Furthermore, although the invention is discussed in the context of grounding the upper electrode, it is contemplated that the inventive arrangement may be employed to ground any electrode, including for example the ground electrode or multiple electrodes, if such is desired. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system comprising:
   an electrode;
   an RF conduction path structure, said RF conduction path structure being configured to provide an RF conduction path between an RF power subsystem and said electrode;
   a switch arrangement formed of an electrically conductive material, said switch arrangement and said RF conduction path structure having two relative positions relative to each other, a first relative position of said two relative positions being characterized by said switch arrangement being electrically coupled with said RF conduction path structure to provide a ground to said electrode, a second relative position of said two relative positions being characterized by said switch arrangement being electrically uncoupled from said RF conduction path;
   an insulator structure configured to interpose between said switch arrangement and said RF conduction path structure to result in said second relative position of said two relative positions;
   an actuator configured to move said insulator structure; and
   a heat sink configured to remove heat from said electrode and to mechanically support said actuator.

2. The plasma processing system of claim 1 further comprising a ground structure disposed between said heat sink and said electrode, said ground structure being configured to provide said ground.

3. The plasma processing system of claim 1 wherein said switch arrangement includes a plurality of biasing fingers configured to physically contact said RF conduction path structure in said first relative position.

4. The plasma processing system of claim 1 wherein said switch arrangement is formed of BeCu.

5. The plasma processing system of claim 1 further comprising a second insulator structure coupled with a ground structure that provides said ground, said second insulator structure being coupled with said electrode, said second insulator structure being disposed between said ground structure and said electrode.

6. The plasma processing system of claim 1 wherein said insulator structure is formed of a ceramic material.

7. The plasma processing system of claim 1 wherein said insulator structure is formed of a polyimide thermoplastic material.

8. The plasma processing system of claim 1 wherein said switch arrangement, said insulator structure, and said RF conduction path structure are annular in shape.

9. The plasma processing system of claim 1 wherein said insulator structure is formed of plastic.

10. The plasma processing system of claim 1 wherein said actuator represents a pneumatic actuator.

11. The plasma processing system of claim 1 wherein said actuator is configured to move said insulator structure in a direction parallel to a line that is perpendicular to a substrate when said substrate is disposed in said plasma processing system for plasma processing.

12. The plasma processing system of claim 1 further comprising a filter arrangement coupled between an output of an RF power source and said ground, said filter arrangement being configured to filter out selective ones of a plurality of RF signals provided to said RF conduction path.

13. The plasma processing system of claim 1 wherein said electrode represents an upper electrode.

14. The plasma processing system of claim 1 wherein said electrode is configured to be energized by a plurality of RF signals having a plurality of frequencies during plasma processing if said switch arrangement is in said second relative position with respect to said RF conduction path structure.

15. The plasma processing system of claim 1 wherein said plasma processing system represents a capacitively coupled plasma processing system.

16. The plasma processing system of claim 1 wherein said plurality of frequencies includes about 2 MHz, about 27 MHz, and about 60 MHz.

17. The plasma processing system of claim 1 wherein said switch arrangement is disposed between said heat sink and said RF conduction path structure.

* * * * *